(12) United States Patent
Shiraga

(10) Patent No.: US 9,161,397 B2
(45) Date of Patent: Oct. 13, 2015

(54) ORGANIC EL DEVICE

(71) Applicant: ROHM CO., LTD., Kyoto (JP)

(72) Inventor: Hiroaki Shiraga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 104 days.

(21) Appl. No.: 14/045,846

(22) Filed: Oct. 4, 2013

(65) Prior Publication Data

US 2014/0097745 A1    Apr. 10, 2014

(30) Foreign Application Priority Data

Oct. 10, 2012 (JP) ................................. 2012-225452
Sep. 3, 2013 (JP) ................................. 2013-182490

(51) Int. Cl.
*H05B 33/06* (2006.01)
*H01L 27/32* (2006.01)

(52) U.S. Cl.
CPC ............. *H05B 33/06* (2013.01); *H01L 27/322* (2013.01); *H01L 27/3262* (2013.01); *H01L 27/3276* (2013.01); *H01L 27/3218* (2013.01)

(58) Field of Classification Search
CPC ........................................................ H01B 51/50
See application file for complete search history.

(56) References Cited

U.S. PATENT DOCUMENTS

2003/0098645 A1*  5/2003  Lee et al. ...................... 313/504

FOREIGN PATENT DOCUMENTS

JP       2005-123089 A     5/2005

* cited by examiner

*Primary Examiner* — Mary Ellen Bowman
(74) *Attorney, Agent, or Firm* — Rabin & Berdo, P.C.

(57) ABSTRACT

An organic EL device of the present invention includes: a base layer; a plurality of bottom electrodes arranged in a surface portion of the base layer at an interval in a lateral direction along a surface of the base layer; an organic layer which contains an organic light emitting material and is placed on the base layer so as to cover the plurality of bottom electrodes collectively and divided into a plurality of pixels respectively corresponding to the plurality of bottom electrodes; a top electrode opposed to the plurality of bottom electrodes with the organic layer interposed therebetween; and a gate electrode, which is placed at a region between mutually adjacent bottom electrodes in a planar view seen from the normal direction of the surface of the base layer, for turning off a parasitic transistor formed by cooperation of the top electrode and mutually adjacent bottom electrodes.

18 Claims, 17 Drawing Sheets

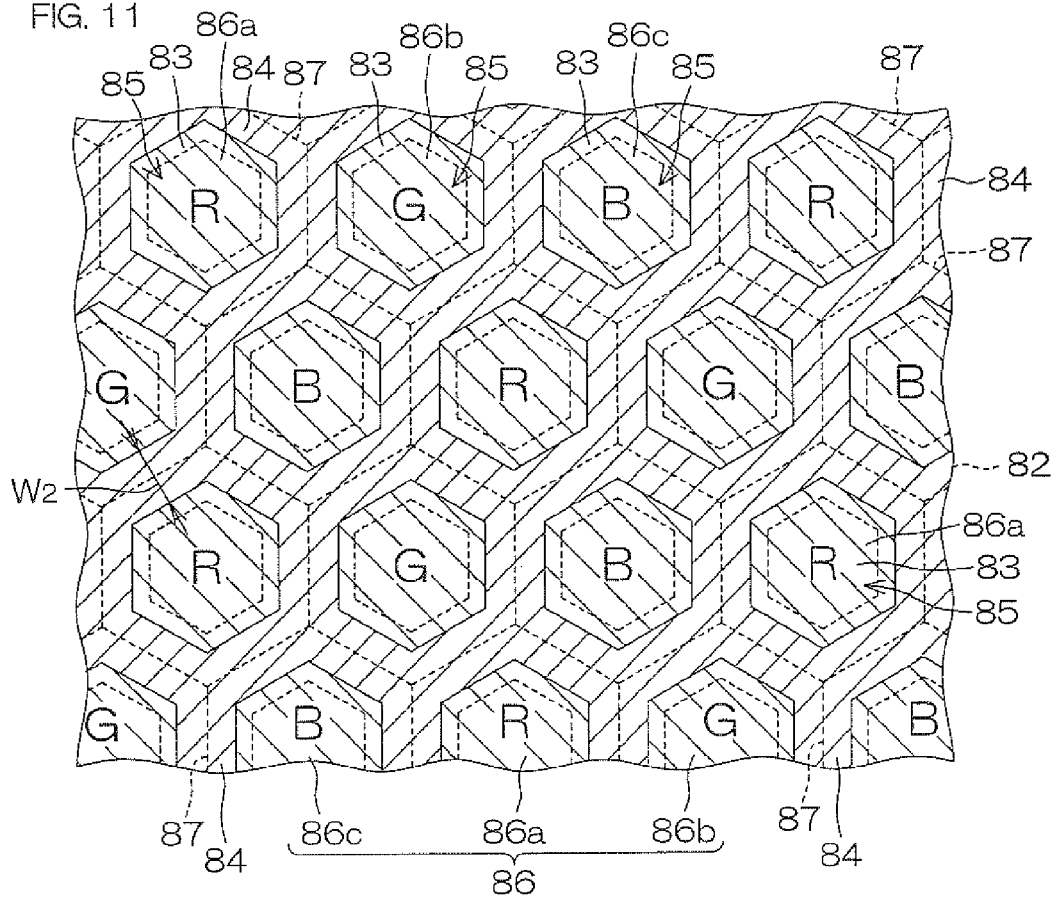

ORGANIC EL DEVICE

TECHNICAL FIELD

The present invention relates to an organic EL device.

BACKGROUND ART

Patent Document 1 (Japanese Unexamined Patent Publication No. 2005-123089) discloses an active matrix color organic EL (Electro Luminescence) display of a top emission type. The color organic EL display has a structure in which a color conversion filter substrate and an organic EL element are combined with each other. An organic EL element has a TFT (Thin Film Transistor), a planarizing layer, a bottom electrode, an organic light emitting layer provided thereon, and a top electrode on a support substrate.

SUMMARY OF INVENTION

A color organic EL display according to Patent Document 1 is provided with a plurality of bottom electrodes formed at an interval. Accordingly, a parasitic transistor is formed between adjacent pixels in such a manner that a top electrode functions as a gate, a bottom electrode of one pixel functions as a source, and a bottom electrode of the other electrode functions as a drain. As a result, leakage current flows from one bottom electrode (source) toward the other bottom electrode (drain), which may possibly trigger electrical color mixing (crosstalk) so that a pixel, which normally does not emit light, emits light. Occurrence of color mixing causes lowering in image quality of an organic EL display and lowering in the NTSC (National Television System Committee) ratio (color gamut). The electrical color mixing can be caused not only by a parasitic transistor but also by pitch narrowing of a bottom electrode, impurities in an organic light emitting layer or the like.

Therefore, the object of the present invention is to provide an organic EL device which can reduce the occurrence of electrical color mixing (crosstalk).

BRIEF DESCRIPTION OF DRAWINGS

FIG. 11 is a schematic plan view of an organic EL device for illustrating a modified example of a pixel array according to a First Preferred Embodiment through Seventh Preferred Embodiment.

DESCRIPTION OF EMBODIMENTS

Figure 1:
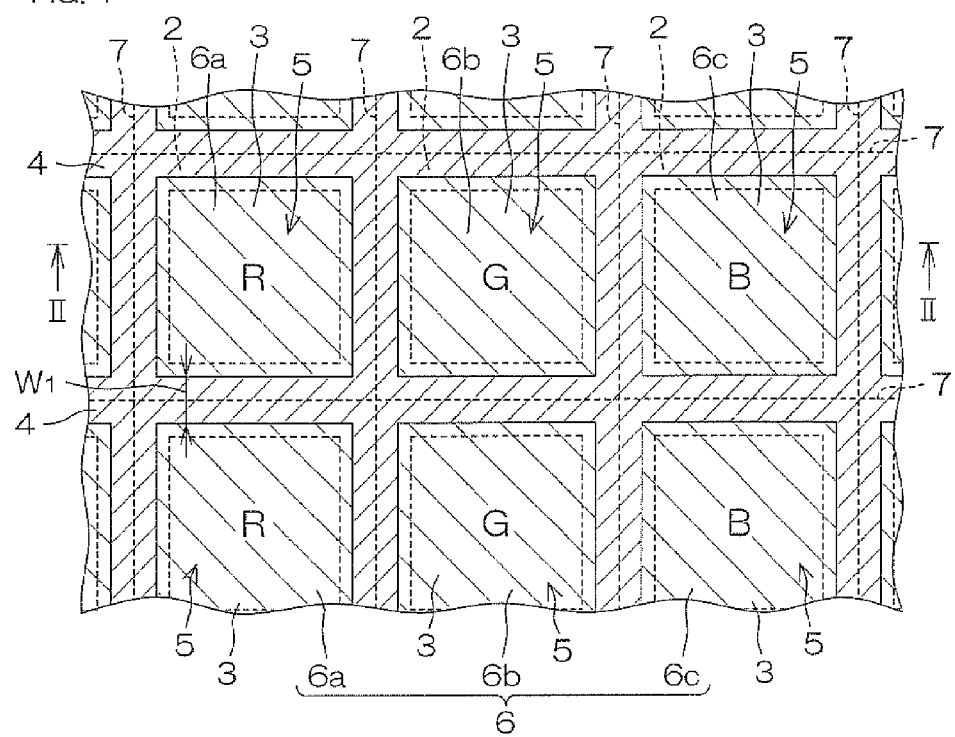
FIG. 1 is a schematic plan view of an organic EL device according to a First Preferred Embodiment of the present invention.

An organic EL device of the present invention includes: a base layer; a plurality of bottom electrodes arranged in a surface portion of the base layer at an interval in a lateral direction along a surface of the base layer; an organic layer which contains an organic light emitting material and is placed on the base layer so as to cover the plurality of bottom electrodes collectively and divided into a plurality of pixels respectively corresponding to the plurality of bottom electrodes; a top electrode opposed to the plurality of bottom electrodes with the organic layer interposed therebetween; and a gate electrode, which is placed at a region between mutually adjacent bottom electrodes in a planar view seen from a normal direction of the surface of the base layer, for turning off a parasitic transistor formed by cooperation of the top electrode and mutually adjacent bottom electrodes.

With such a structure, a channel is formed at a parasitic transistor in which a top electrode functions as a gate, a bottom electrode of one of mutually adjacent pixels functions as a source, and a bottom electrode of the other pixel functions as a drain. Even when leakage current flows from one bottom electrode toward the other bottom electrode, it is possible to limit the expansion of a channel in the parasitic transistor by applying a predetermined voltage to the gate electrode. Accordingly, it is possible to eliminate or decrease flow of leakage current to a next pixel. As a result, it becomes possible to reduce the occurrence of electrical color mixing (crosstalk).

The gate electrode is preferably formed to surround the bottom electrodes in the planar view.

With such a structure, a gate electrode is placed around a bottom electrode, thereby it is possible to decrease leakage current reliably whichever direction leakage current from the bottom electrode flows in. As a result, it becomes possible to further reduce electrical color mixing (crosstalk).

The base layer preferably includes a substrate having a surface on which a plurality of circuit elements are formed, and an interlayer film that is placed on the substrate and has a surface portion in which the plurality of bottom electrodes are arranged and wiring for electrically connecting the plurality of circuit elements with the plurality of bottom electrodes, and the gate electrode is preferably embedded in the interlayer film and opposed to a region between the bottom electrodes with a portion of the interlayer film interposed therebetween.

With such a structure, it is possible to eliminate a step which may be formed by projection of a gate electrode from the surface of the interlayer film at a region between mutually adjacent bottom electrodes, i.e., a place near each pixel (light emitting pixel). Accordingly, it is possible to prevent light generated at each pixel from being reflected at the gate electrode and travelling in an unintended direction. As a result, it becomes possible to reduce the occurrence of deflection of light or optical color mixing at each pixel.

The gate electrode preferably has a portion overlapped with a rim portion of the bottom electrodes in the planar view.

With such a structure, the gate electrode is placed all over a region below a region between bottom electrodes, thereby it is possible to limit the expansion of the channel region all over a region between bottom electrodes. Accordingly, it is possible to further decrease leakage current.

The wiring preferably includes a wiring layer placed along the surface of the substrate and a via for connecting the wiring layer with the bottom electrode, and the gate electrode preferably includes a gate wiring layer placed at the same layer as the wiring layer.

With such a structure, the gate electrode can be formed by the same process step as that of the wiring layer in the interlayer film, thereby it is possible to simplify the manufacturing process steps.

The wiring preferably includes a wiring layer placed along the surface of the substrate and a via for connecting the wiring layer with the bottom electrode, and the gate electrode preferably includes a gate wiring layer placed at a layer different from the wiring layer.

With such a structure, the position of the gate electrode is not constrained by the position of the wiring layer, thereby it is possible to place the gate electrode at, for example, a position near the surface of the interlayer film. Consequently, it becomes easier to cause voltage applied to the gate electrode to act on a region between bottom electrodes. Accordingly, it becomes possible to further limit the expansion of the channel region.

The gate electrode is preferably formed to extend from the surface of the gate wiring layer to the surface of the base layer and preferably further includes a gate via which is opposed to the organic layer with a portion of the interlayer film interposed therebetween.

With such a structure, the gate via is formed to extend from the surface of the gate wiring layer to the surface of the base layer, thereby it is possible to locate a portion where voltage applied to the gate wiring layer acts on the channel of the parasitic transistor, nearer to the channel. That is, in a case where a gate via is formed, it is possible to cause voltage applied to the gate wiring layer to act on the channel of the parasitic transistor more effectively than a case where a gate wiring layer is formed singularly. This makes it possible to further limit the expansion of the channel region and therefore to limit flow of leakage current to a next pixel effectively. As a result, it becomes possible to reduce the occurrence of electrical color mixing (crosstalk) effectively.

The gate via is preferably formed to have the same shape as that of the via.

With such a structure, the gate via can be formed in the same process step as a process step of forming the via for connecting the wiring layer with a bottom electrode, thereby it is possible to prevent increase of the number of manufacturing process steps.

Moreover, the base layer may include a substrate having a surface on which a plurality of circuit elements are formed, and an interlayer film that is placed on the substrate and has a surface portion in which the plurality of bottom electrodes are placed and wiring for electrically connecting the plurality of circuit elements with the plurality of bottom electrodes, and the gate electrode may be placed at a region between bottom electrodes on the interlayer film and have a surface coated with an insulating film.

The plurality of bottom electrodes preferably include an embedded bottom electrode, which is embedded in the base layer so that a surface thereof is located at the same plane as the surface of the base layer or at a lower position than that of the surface of the base layer.

With such a structure, the bottom electrode is embedded in the base layer, thereby it is possible to prevent light generated at each pixel from being reflected at the bottom electrode and travelling in an unintended direction. As a result, it becomes possible to reduce the occurrence of deflection of light or optical color mixing (crosstalk) at each pixel.

A width of a region between the bottom electrodes may be equal to or smaller than 2 μm.

That is, the effect of limitation of channel expansion of a parasitic transistor according to the present invention can be exerted especially in a micro display in which pitch narrowing of bottom electrodes may easily cause flow of leakage current into an adjoining pixel.

The plurality of bottom electrodes may be arranged in a matrix form or may be arranged in a honeycomb form.

The plurality of bottom electrodes are preferably made of, for example, aluminum (Al), molybdenum (Mo), silver (Ag), platinum (Pt) or an alloy thereof.

Moreover, the top electrode is preferably made of aluminum (Al), silver (Ag), magnesium silver (MgAg), tin-doped indium oxide (ITO) or zinc-doped indium oxide (IZO). When the top electrode is made of aluminum (Al), silver (Ag) or magnesium silver (MgAg), the thickness thereof is preferably 0.1 nm to 50 nm. When the top electrode is made of tin-doped indium oxide (ITO) or zinc-doped indium oxide (IZO), the thickness thereof is preferably 1.0 nm to 500 nm.

The organic EL device may further include a color filter placed on the top electrode.

With such a structure, it is possible to obtain favorable color development by causing light generated at an organic layer to pass through the color filter.

A voltage different from a voltage applied to the bottom electrodes is preferably applied continuously to the gate electrode. In such a case, the voltage applied to the gate electrode is preferably higher than the voltage applied to the bottom electrodes.

The following description will explain preferred embodiments of the present invention in detail with reference to the accompanying drawings.

FIG. 1 is a schematic plan view of an organic EL device according to a First Preferred Embodiment of the present invention.

An organic EL device 1 according to the First Preferred Embodiment is an active matrix organic EL device of a so-called top-emission type.

The organic EL device 1 includes a base layer 2, a bottom electrode 3, an embedded gate electrode 4, a plurality of pixels 5 and a color filter 6. In addition, the bottom electrode 3 can be used as an anode or a cathode, although the following description of the present preferred embodiment explains a case where the bottom electrode 3 is constituted of an anode as an example (the same applies hereinafter for a Second Preferred Embodiment through a Seventh Preferred Embodiment).

A plurality of bottom electrodes 3 are provided at an interval in a lateral direction along a surface of the base layer 2. The array pattern of the plurality of bottom electrodes 3 is a matrix form (e.g., square matrix form) in the present preferred embodiment. The width $W_1$ of a region between mutually adjacent bottom electrodes 3 is preferably equal to or smaller than 2 μm. The bottom electrodes 3 are made of, for example, a metal material having a high reflectance such as aluminum (Al), molybdenum (Mo), silver (Ag) or platinum (Pt), or an alloy material (e.g., aluminum alloy (AlCu)) consisting primarily of such a metal material having a high reflectance.

The embedded gate electrode 4 is placed in the base layer 2 so as to surround each bottom electrode 3 in a planar view seen from the normal direction of the surface of the base layer 2. In the present preferred embodiment, embedded gate electrodes 4 are arranged in a lattice shape on boundaries 7 of the respective pixels 5 as an array example. This allows the embedded gate electrode 4, which is sandwiched between mutually adjacent bottom electrodes 3, to be shared by the bottom electrodes 3.

The plurality of pixels 5 are arranged in a matrix form (square matrix form) so as to correspond to the respective bottom electrodes 3. More specifically, the respective bottom electrodes 3 are arranged regularly at a predetermined interval, and the respective bottom electrodes 3 operate independent of each other. This sets boundaries 7 respectively between adjacent bottom electrodes 3. A pixel 5 is set by a portion surrounded by the boundaries 7.

The color filter 6 is placed so as to cover the respective pixels 5 collectively. The color filter 6 includes an ROB filter composed of an R (Red) filter 6a, a G (Green) filter 6b and a B (Blue) filter 6c. The respective filters 6 (6a, 6b, 6c) are arranged in a matrix form so as to correspond to the respective pixels 5. In the present preferred embodiment, a structure in which the R filter 6a, the G filter 6b and the B filter 6c are arranged regularly in a line is illustrated as an array example of the respective filters 6. In addition, the array of the respective filters 6 is not limited to the array of the present preferred embodiment and, for example, one R filter 6a and one B filter 6c may be arranged to be opposed to each other while two G filters 6b may be arranged at the other opposing corners.

Figure 2:
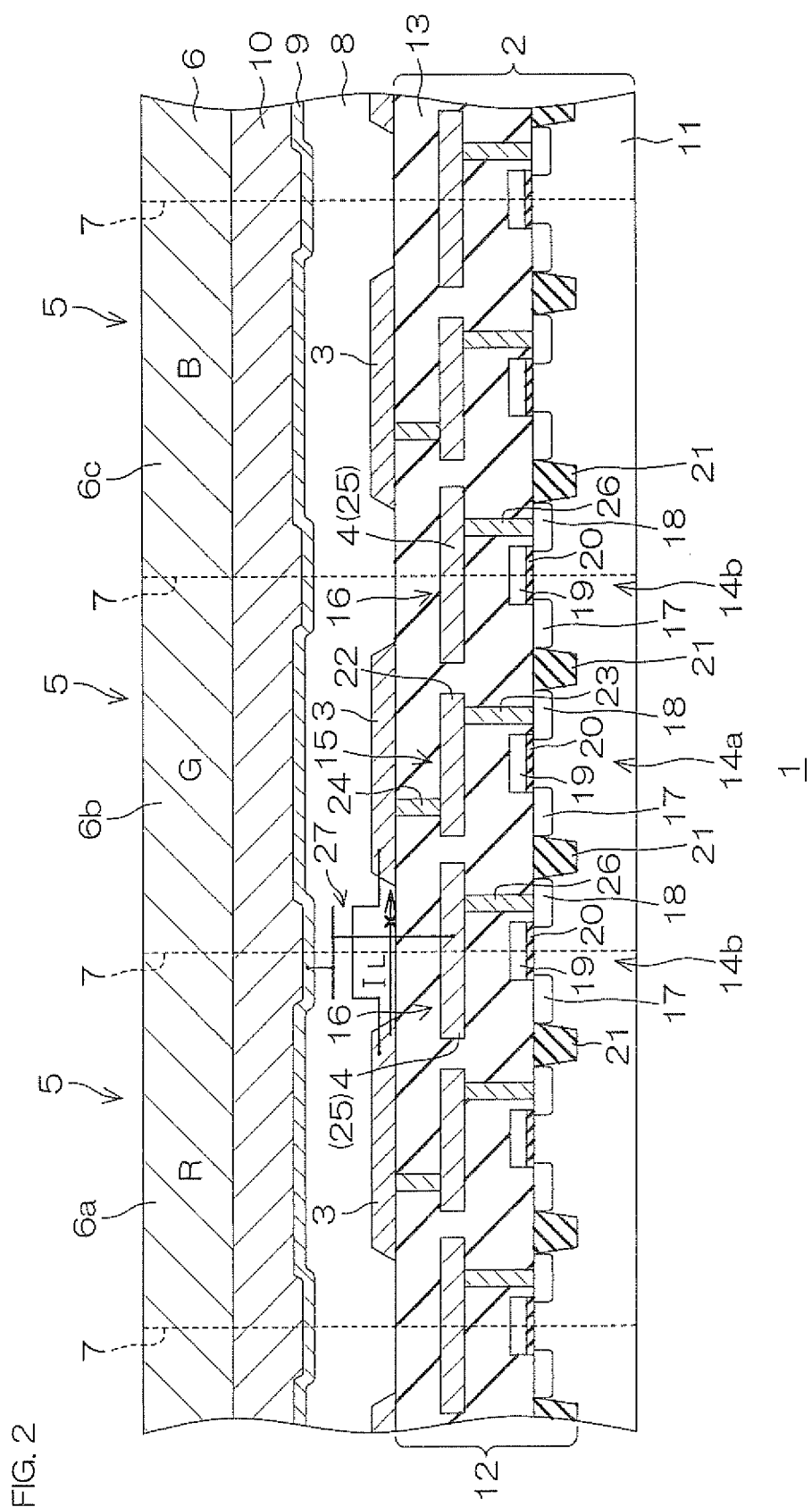
FIG. 2 is a sectional view taken along the section line II-II in FIG. 1.

Next, the cross-section structure of the organic EL device 1 will be explained. FIG. 2 is a sectional view taken along the section line in FIG. 1.

As illustrated in FIG. 2, the organic EL device 1 further includes an organic layer 8 placed between the base layer 2 and the color filter 6, a top electrode 9 and a sealing layer 10. The organic layer 8, the top electrode 9 and the sealing layer 10 are laminated in this order from the surface of the base layer 2.

The base layer 2 includes a substrate 11, an electric potential control circuit 12 and an interlayer film 13. The substrate 11 in the present preferred embodiment is a p-type silicon substrate. In addition, the substrate 11 may be an n-type silicon substrate, glass, or a glass barrier coated plastic film, for example.

The electric potential control circuit 12 includes circuit elements 14a and 14b, and first wiring 15 and second wiring 16 placed in the interlayer film 13. The circuit element 14a is electrically connected with a bottom electrode 3 via the first wiring 15, while the circuit element 14b is electrically connected with an embedded gate electrode 4 which constitutes a portion of the second wiring 16. FIG. 2 illustrates an n-type MOSFET (Metal-Oxide-Semiconductor Field Effect Transistor) as an example of the respective circuit elements 14a and 14b.

The respective circuit elements 14a and 14b are formed at a surface portion of the substrate 11. Each circuit element 14a, 14b includes a source layer 17 and a drain layer 18 which are formed selectively at a surface portion of the substrate 11, and a gate electrode 19 placed between the source layer 17 and the drain layer 18. The interlayer film 13 is placed on the substrate 11 so as to cover the gate electrodes 19. A gate insulating film 20 is placed between the gate electrode 19 and the substrate 11. An insulating layer 21 is placed at a surface portion of the substrate 11 between the circuit elements 14a and 14b, and the respective circuit elements 14a and 14b operate independent of each other.

The first wiring 15 includes a first wiring layer 22, a first via electrode 23 and a second via electrode 24. A plurality of first wiring layers 22 are arranged at a middle portion in the thickness direction of the interlayer film 13 at an interval in a lateral direction along a surface of the interlayer film 13. The array pattern of the plurality of first wiring layers 22 in the present preferred embodiment is a matrix form (e.g., square matrix form).

The first via electrode 23 extends in the thickness direction of the interlayer film 13 from a rear surface of the first wiring layer 22 and is connected with a circuit element 14a. The second via electrode 24 extends from a surface of the first wiring layer 22 toward the surface of the interlayer film 13 (a rear surface of the bottom electrode 3) and is connected with a bottom electrode 3. This electrically connects each bottom electrode 3 with a corresponding circuit element 14a via the first wiring 15.

The second wiring 16 includes a second wiring layer 25 and a third via electrode 26. The second wiring layer 25 is placed at the same layer as the first wiring layer 22. More specifically, the second wiring layer 25 is placed at a predetermined interval from the first wiring layer 22 in a planar view seen from the normal direction of the surface of the base layer 2 so as to surround the first wiring layer 22. Regarding the second wiring layer 25, a portion of a rear surface is connected with the third via electrode 26 as will be described later so that a region which is not covered with the interlayer film 13 selectively exists at the rear surface, while the whole region of a surface is covered with the interlayer film 13. This causes the second wiring layer 25 to be insulated by the interlayer film 13 and a structural object (e.g., the bottom electrode 3 or the organic layer 8) formed on the surface of the interlayer film 13 and to be opposed to a region between adjacent bottom electrodes 3 with a portion of the interlayer film 13 interposed therebetween.

Also, in the present preferred embodiment, the second wiring layer 25 has a portion overlapped with a rimportion of the bottom electrode 3 with the interlayer film 13 interposed therebetween. That is, a portion of the second wiring layer 25 is overlapped with a rim portion of each bottom electrode 3. More specifically, regarding the second wiring layer 25 having a lattice shape, an inner rim portion of an annular lattice frame along the rim of the bottom electrode 3 is formed to be overlapped with the rim portion of the bottom electrode 3. In addition, the second wiring layer 25 may be placed so that the whole thereof is opposed to a region between the bottom electrodes 3, although a portion of the second wiring layer 25 is overlapped with the rim portion of each bottom electrode 3 in the present preferred embodiment.

The third via electrode 26 extends in the thickness direction of the interlayer film 13 from a rear surface of the second wiring layer 25 and is connected with a circuit element 14a. This electrically connects the second wiring layer 25 with a corresponding circuit element 14b via the third via electrode 26. That is, voltage to be applied to the second wiring layer 25 is controlled by the electric potential control circuit 12 independent of each bottom electrode 3.

The bottom electrodes 3 are placed on the interlayer film 13. The bottom electrodes 3 protrude from the surface of the interlayer film 13 toward the organic layer 8 and have a tapered shape in which the width thereof narrows gradually from the bottom surface of the bottom electrodes 3 toward the upper surface thereof.

The bottom electrodes 3 are electrically connected with the electric potential control circuit 12 as described above, so that on/off of voltage to be applied to the bottom electrodes 3 is controlled by the electric potential control circuit 12. When the bottom electrodes 3 are on, a predetermined constant voltage (positive voltage) is applied to the bottom electrodes 3 so as to establish electrical continuity in the organic layer 8, and holes are injected from the bottom electrodes 3 to the organic layer 8. When the bottom electrodes 3 are off, the bottom electrodes 3 are open.

The second wiring layer 25 is electrically connected with the electric potential control circuit 12 as described above and a predetermined constant voltage (positive voltage) different from voltage to be applied to the bottom electrodes 3 is applied continuously. Voltage to be applied to the second wiring layer 25 is preferably higher than the voltage to be applied to the respective bottom electrodes 3, for example. This forms a MOS field-effect transistor (MOSFET) including a bottom electrode 3 of one of mutually adjacent pixels 5 functioning as a source, a bottom electrode 3 of the other pixel 5 functioning as a drain, the second wiring layer 25 functioning as a gate, and the interlayer film 13, which is placed on the surface of the second wiring layer 25, functioning as a gate insulating film. That is, the second wiring layer 25 functions as an embedded gate electrode 4.

The organic layer 8 is placed on the base layer 2 so as to cover the respective bottom electrodes 3 collectively. The organic layer 8 includes a hole transport layer (HTL), an electron transport layer (ETT), and an organic light emitting layer (LEL) which is interposed between the hole transport layer and the electron transport layer.

The hole transport layer is placed on the base layer 2 so as to cover the respective bottom electrodes 3 collectively. When voltage higher than a threshold voltage of the organic layer 8 is applied to the bottom electrodes 3, holes are injected into the organic light emitting layer via the hole transport layer. The hole transport layer is made of, for example, 4,4'-bis[N-(1-naphthyl-1-)N-phenyl-amino]-biphenyl.

The electron transport layer is placed so as to be in contact with a rear surface of the top electrode 9. When voltage higher than the threshold voltage of the organic layer 8 is applied to the bottom electrodes 3, electrons are injected into the organic light emitting layer via the electron transport layer. The electron transport layer is made of, for example, aluminum(8-hydroxy-chinolinate).

The organic light emitting layer includes an organic light emitting material such as aluminum(8-hydroxy-chinolinate), for example. The organic light emitting material includes a complex including, for example, rubrene or a transition metal atom as dopant. In such a case, the organic light emitting layer emits white light.

The organic light emitting layer is interposed between the hole transport layer and the electron transport layer. Holes injected into the organic light emitting layer via the hole transport layer and electrons injected into the organic light emitting layer via the electron transport layer combine with each other in the organic light emitting layer. Energy generated by such combination excites the organic light emitting material forming the organic light emitting layer. Light is generated while the excited organic light emitting material returns to the ground state. The light travels from the organic light emitting layer to the top electrode 9 side or is reflected at the bottom electrodes 3, passes through the color filter 6 and is taken out from a surface side of the substrate 11.

The top electrode 9 is placed to be opposed to the bottom electrodes 3 with the organic layer 8 interposed therebetween. The top electrode 9 is fixed at, for example, the ground potential. Consequently, when voltage higher than the threshold voltage of the organic layer 8 is applied to the bottom electrodes 3, electrical continuity is established in the organic layer 8 in such a case.

The top electrode 9 includes, for example, a metal thin film layer made of aluminum (Al), silver (Ag) or magnesium silver (MgAg), or a metal oxide film layer made of tin-doped indium oxide (ITO) or zinc-doped indium oxide.

When the top electrode 9 is made of a metal thin film layer, the thickness of the top electrode 9 is preferably 0.1 nm to 50 nm. In such a case, the top electrode 9 is a light transmissive electrode. When the top electrode 9 is made of a metal oxide film layer, the thickness of the top electrode 9 is preferably 1 nm to 500 nm. In such a case, the top electrode 9 is a transparent electrode.

The sealing layer 10 is placed on the top electrode 9. The sealing layer 10 is provided to bond the top electrode 9 with the color filter 6 and is provided to prevent the top electrode 9 from being exposed to the atmosphere, which may cause oxidation or corrosion. The sealing layer 10 includes, for example, an organic insulating layer such as silicon nitride ($SiN_x$), silicon oxynitride ($SiO_xN_y$), silicon oxide ($SiO_x$) or aluminum oxide ($AlO_x$).

The color filter 6 is placed on the sealing layer 10. The color filter 6 is an RGB filter including an R filter 6a, a G filter 6b and a B filter 6c. Each filter 6 (6a, 6b, 6c) is placed to correspond to each pixel 5. This causes light generated at the organic light emitting layer and light reflected at the bottom electrodes 3 to pass through the color filter band have a corresponding different wavelength. A color resist including pigment as a base, a transmissive resist formed using a nanoimprint technology, or a gelatin film can be applied to the color filter 6, for example.

With such a structure, a channel is formed at a parasitic transistor 27 including the top electrode 9 functioning as a gate, a bottom electrode 3 of one of mutually adjacent pixels 5 functioning as a source, and a bottom electrode 3 of the other pixel 5 functioning as a drain as illustrated in FIG. 2, thereby it is possible to limit the expansion of the channel of the parasitic transistor 27 by applying a predetermined voltage to the embedded gate electrode 4 even when leakage current $I_L$ flows from one bottom electrode 3 to the other bottom electrode 3. Accordingly, it is possible to eliminate or decrease the flow of leakage current $I_L$ to a next pixel 5. As a result, it becomes possible to reduce the occurrence of electrical color mixing (crosstalk). Furthermore, it is possible to limit the expansion of the channel region all over the region between bottom electrodes 3, since the embedded gate electrode 4 (second wiring layer 25) is placed all over a region below a region between bottom electrodes 3 so as to be overlapped with a rim portion of each bottom electrode 3. This reliably decreases leakage current $I_L$ whichever direction leakage current $I_L$ from each bottom electrode 3 flows in.

Moreover, since the embedded gate electrode 4 is formed at the same layer as the first wiring layer 22, it is possible to use the formation process step of the first wiring layer 22 to form the embedded gate electrode 4 (second wiring layer 25) simultaneously. Accordingly, it is possible to use a miniaturization technology of the first wiring layer 22 to miniaturize the embedded gate electrode 4 together. Moreover, since it is possible to form the first wiring layer 22 and the embedded gate electrode 4 simultaneously, it is possible to simplify the manufacturing process steps.

Moreover, a step is not formed at a region between mutually adjacent bottom electrodes 3, i.e., a place near each pixel 5, even when the embedded gate electrode 4 protrudes from the surface of the interlayer film 13. Accordingly, it is possible to prevent light generated at each pixel 5 from being reflected at the embedded gate electrode 4 and travelling in an unintended direction. As a result, it is possible to reduce the occurrence of deflection of light or optical color mixing at each pixel 5.

Moreover, the reduction effect of leakage current $I_L$ by the embedded gate electrode 4 according to the present invention can be exerted especially in a micro display in which pitch narrowing of the bottom electrodes 3 may easily cause flow of leakage current $I_L$ into an adjoining pixel 5.

Figure 3:
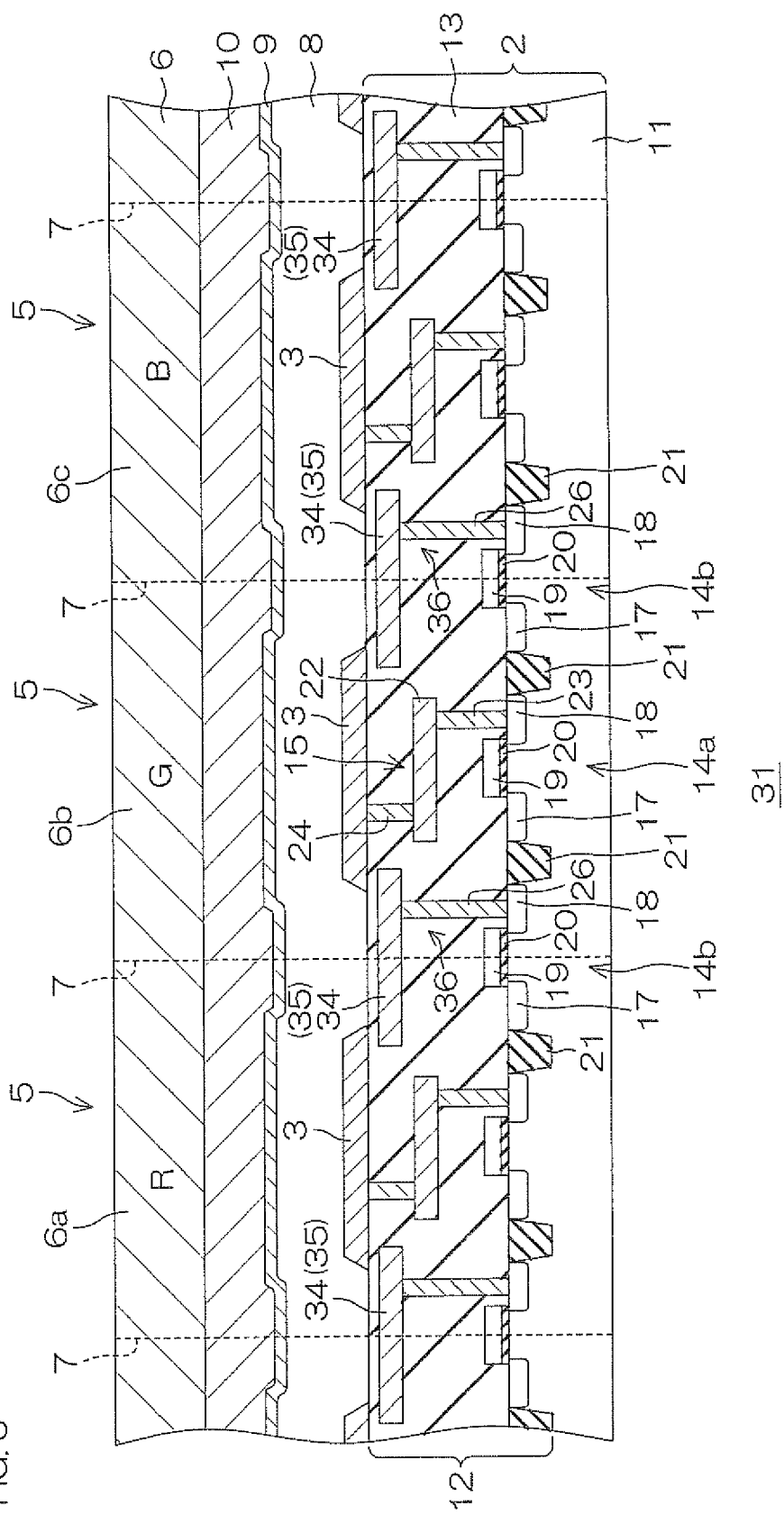
FIG. 3 is a schematic sectional view of an organic EL device according to a Second Preferred Embodiment of the present invention.

FIG. 3 is a schematic sectional view of an organic EL device 31 according to a Second Preferred Embodiment of the present invention. Components in FIG. 3 are indicated by the same reference signs as those of equivalent components illustrated in FIG. 2, and explanation thereof will be omitted.

The structure of the organic EL device 31 according to the Second Preferred Embodiment is different from that of the First Preferred Embodiment in that second wiring 36 including a second wiring layer 35 placed at a layer different from a first wiring layer 22 is provided.

More specifically, the second wiring layer 35 is placed at a position nearer to a surface of an interlayer film 13 than the first wiring layer 22. Moreover, the second wiring layer 35 is connected with a corresponding circuit element 14b via a third via electrode 26. Consequently, the second wiring layer 35 functions as an embedded gate electrode 34.

With such a structure, the embedded gate electrode 34 (second wiring layer 35) is placed at a position nearer to the surface of the interlayer film 13 than a case where the embedded gate electrode 34 is placed at the same layer as the first wiring layer 22. Consequently, it becomes easier to cause voltage applied to the embedded gate electrode 34 to act on a portion of a region between bottom electrodes 3 where a channel region is formed. Accordingly, it is possible to further limit the expansion of the channel region. As a result, it becomes possible to further reduce the occurrence of electrical color mixing (crosstalk).

Figure 4:
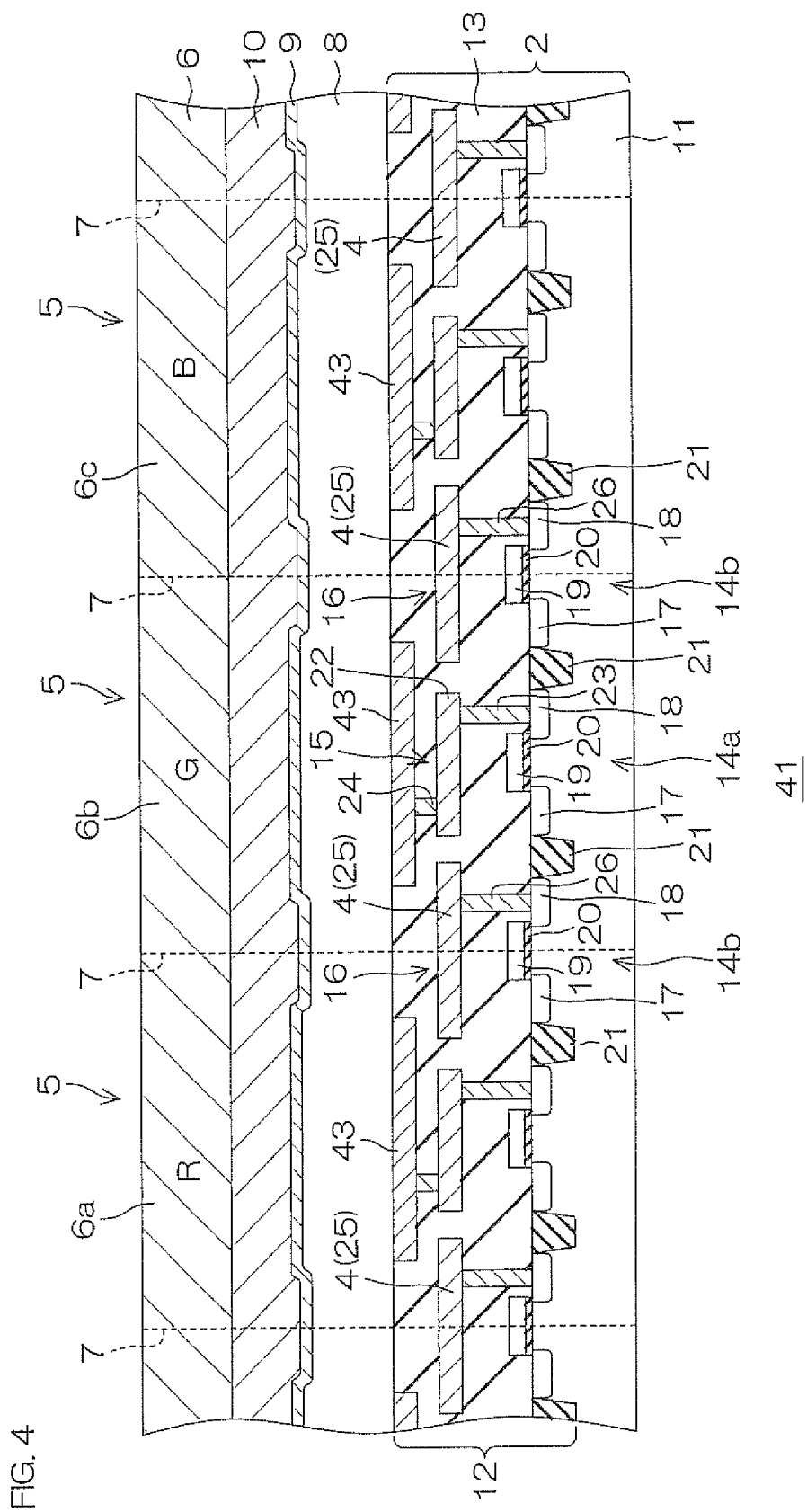
FIG. 4 is a schematic sectional view of an organic EL device according to a Third Preferred Embodiment of the present invention.

FIG. 4 is a schematic sectional view of an organic EL device 41 according to a Third Preferred Embodiment of the present invention. Components in FIG. 4 are indicated by the same reference signs as those of equivalent components illustrated in FIGS. 2 and 3, and explanation thereof will be omitted.

The structure of the organic EL device 41 according to the Third Preferred Embodiment is different from that of the First Preferred Embodiment in that bottom electrodes 43 which are embedded in a surface portion of an interlayer film 13 so that a surface thereof is located at the same plane as the surface of the interlayer film 13 are included.

With such a structure, the bottom electrodes 43 are embedded in the interlayer film 13, thereby it is possible to prevent light generated at each pixel 5 from being reflected at bottom electrodes 43 and travelling in an unintended direction. As a result, it becomes possible to reduce the occurrence of deflection of light or optical color mixing (crosstalk) at each pixel 5. In such a case, a surface of the bottom electrodes 43 may be located at a lower position than that of the surface of the interlayer film 13.

Figure 5:
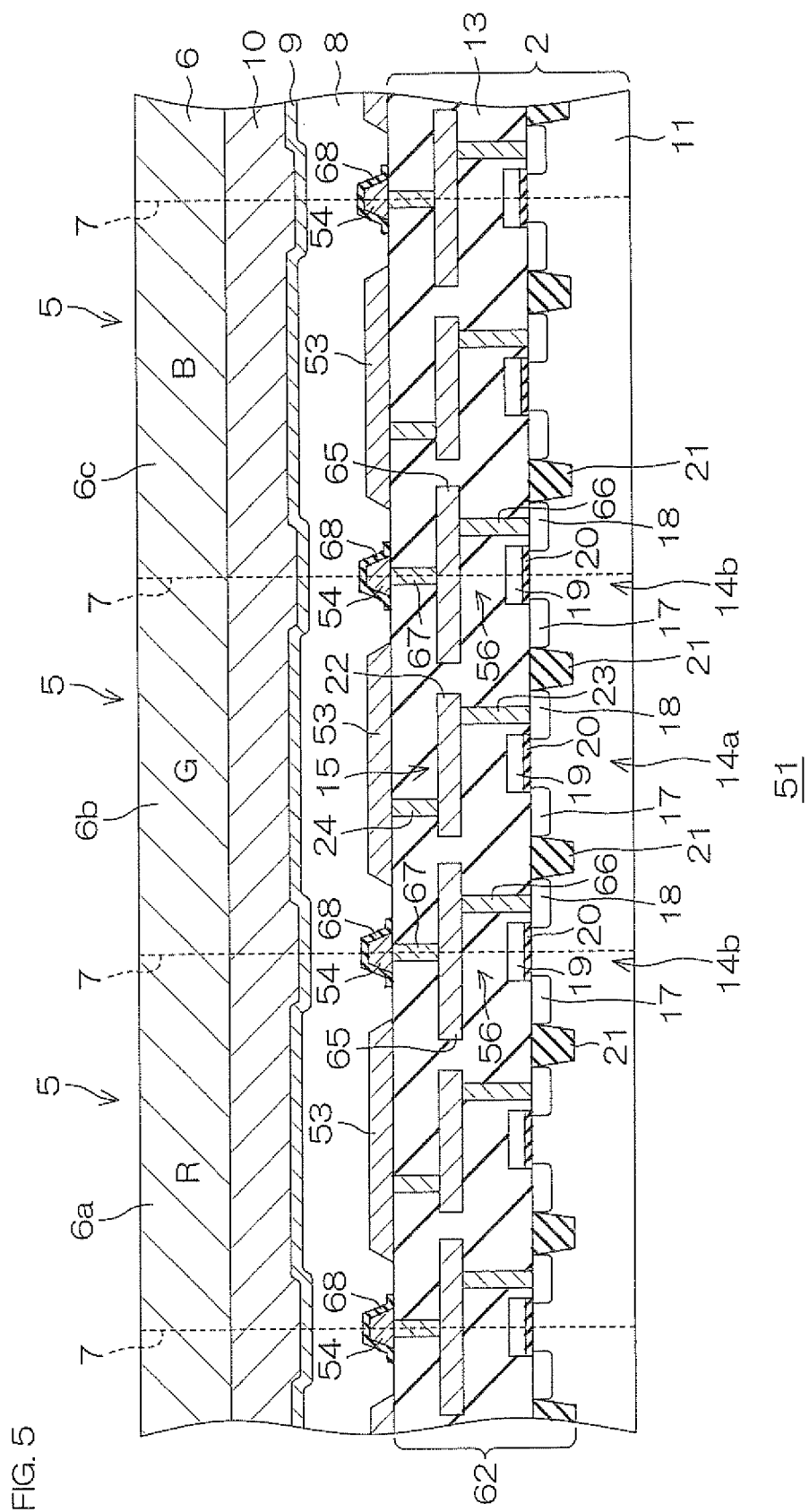
FIG. 5 is a schematic sectional view of an organic EL device according to a Fourth Preferred Embodiment of the present invention.

FIG. 5 is a schematic sectional view of an organic EL device 51 according to a Fourth Preferred Embodiment of the present invention. Components in FIG. 5 are indicated by the same reference signs as those of equivalent components illustrated in FIGS. 2, 3 and 4, and explanation thereof will be omitted.

The structure of the organic EL device 51 according to the Fourth Preferred Embodiment is different from that of the First Preferred Embodiment in that exposed gate electrodes 54, which are placed so as to project from a surface of an interlayer film 13 toward an organic layer 8, and second wiring 56 for connecting an exposed gate electrode 54 with a corresponding circuit element 14b are included.

Each exposed gate electrode 54 is formed at a predetermined interval from a bottom electrode 53 in a planar ( ) view seen from the normal direction of a surface of a base layer 2 so as to surround each bottom electrode 53. In the present preferred embodiment, exposed gate electrodes 54 are arranged in a lattice shape on boundaries 7 of the respective pixels 5 as an array example. Moreover, the surface of each exposed gate electrode 54 is coated with a gate insulating film 68.

Each second wiring 56 includes a second wiring layer 65, a third via electrode 66 and a fourth via electrode 67. The second wiring layer 65 is placed at the same layer as a first wiring layer 22. More specifically, each second wiring layer 65 is placed at a predetermined interval from each first wiring layer 22 in a planar view seen from the normal direction of the surface of the base layer 2 so as to surround each first wiring layer 22. In addition, the second wiring layer 65 may be placed at the upper side (a side near to the bottom electrodes 53) of the first wiring layer 22 or at the lower side (a side near to the substrate 11).

The third via electrode 66 extends in the thickness direction of the interlayer film 13 from the rear surface of the second wiring layer 65 and is connected with the circuit element 14b. Each fourth via electrode 67 extends from the surface of the second wiring layer 65 to the surface of the interlayer film 13 (the rear surface of the exposed gate electrode 54) and is connected with an exposed gate electrode 54.

This electrically connects each exposed gate electrode 54 with the corresponding circuit element 14b via the second wiring 56. That is, voltage to be applied to the exposed gate electrode 54 is controlled by an electric potential control circuit 62 including the circuit element 14b and the second wiring 56, independent of the respective bottom electrodes 53.

With such a structure, it is also possible to exert an effect similar to that of the First Preferred Embodiment.

Figure 6:
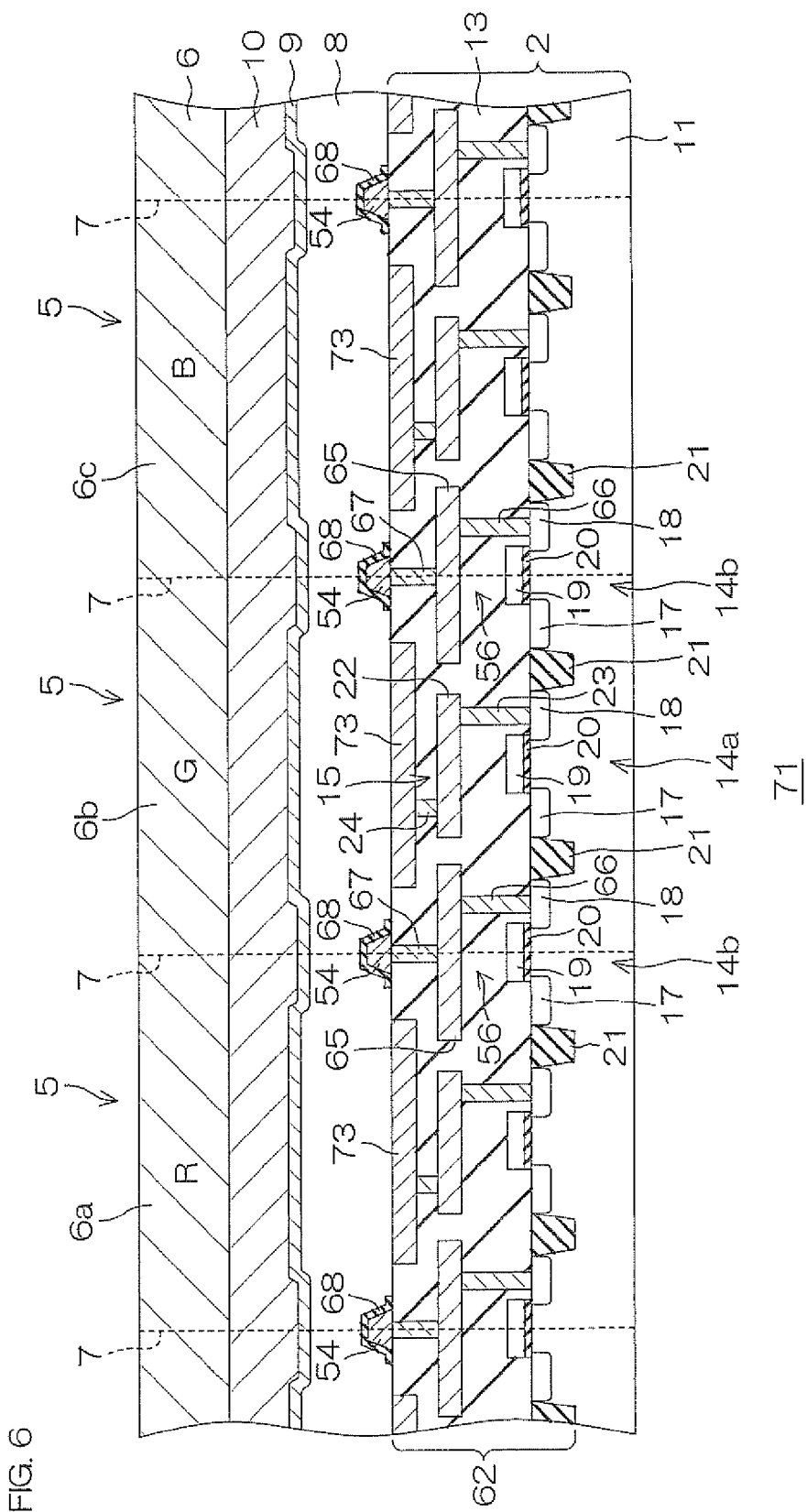
FIG. 6 is a schematic sectional view of an organic EL device according to a Fifth Preferred Embodiment of the present invention.

FIG. 6 is a schematic sectional view of an organic EL device 71 according to a Fifth Preferred Embodiment of the present invention. Components in FIG. 6 are indicated by the same reference signs as those of equivalent components illustrated in FIG. 5, and explanation thereof will be omitted.

The structure of the organic EL device 71 according to the Fifth Preferred Embodiment is different from that of the Fourth Preferred Embodiment in that bottom electrodes 73, which are embedded in a surface portion of an interlayer film 13 so that a surface thereof is located at the same plane as the surface of the interlayer film 13, are included.

With such a structure, the bottom electrodes 73 are embedded in the interlayer film 13, thereby it is possible to prevent light generated at each pixel 5 from being reflected at the bottom electrodes 73 and travelling in an unintended direction. As a result, it becomes possible to reduce the occurrence of deflection of light or optical color mixing (crosstalk) at each pixel 5. In such a case, the surface of the bottom electrodes 73 may be located at a position lower than the surface of the interlayer film 13.

Figure 7:
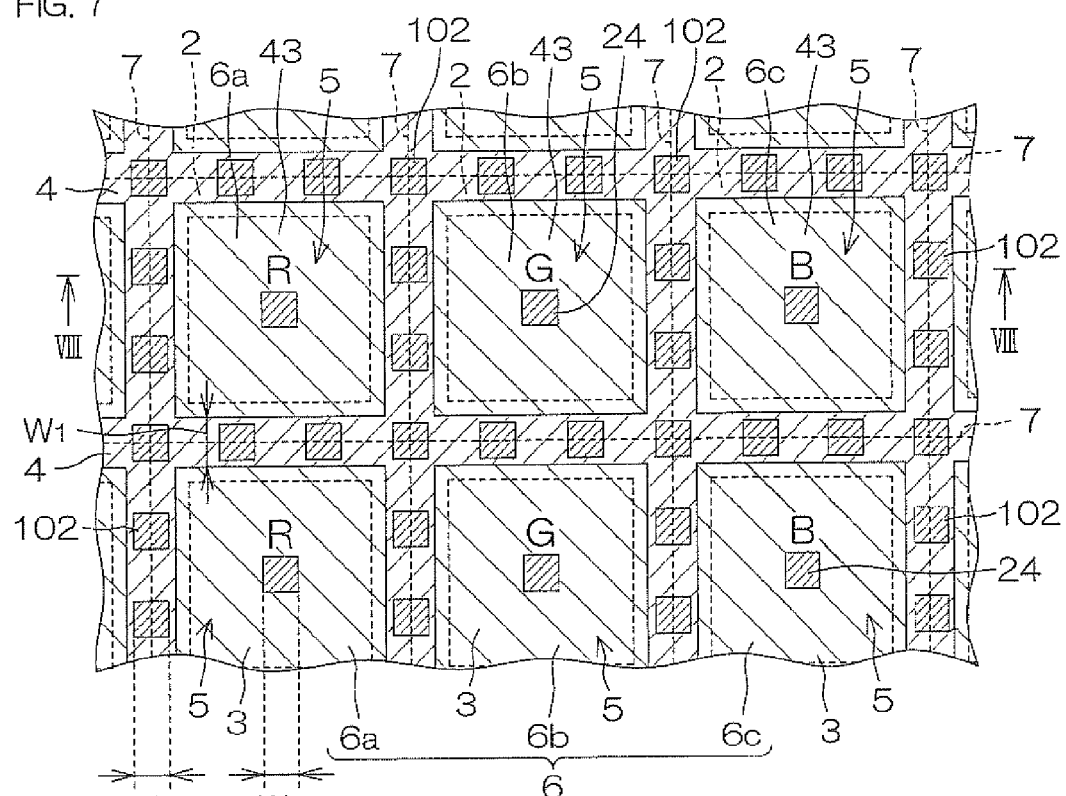
FIG. 7 is a schematic plan view of an organic EL device according to a Sixth Preferred Embodiment of the present invention.
Figure 8:
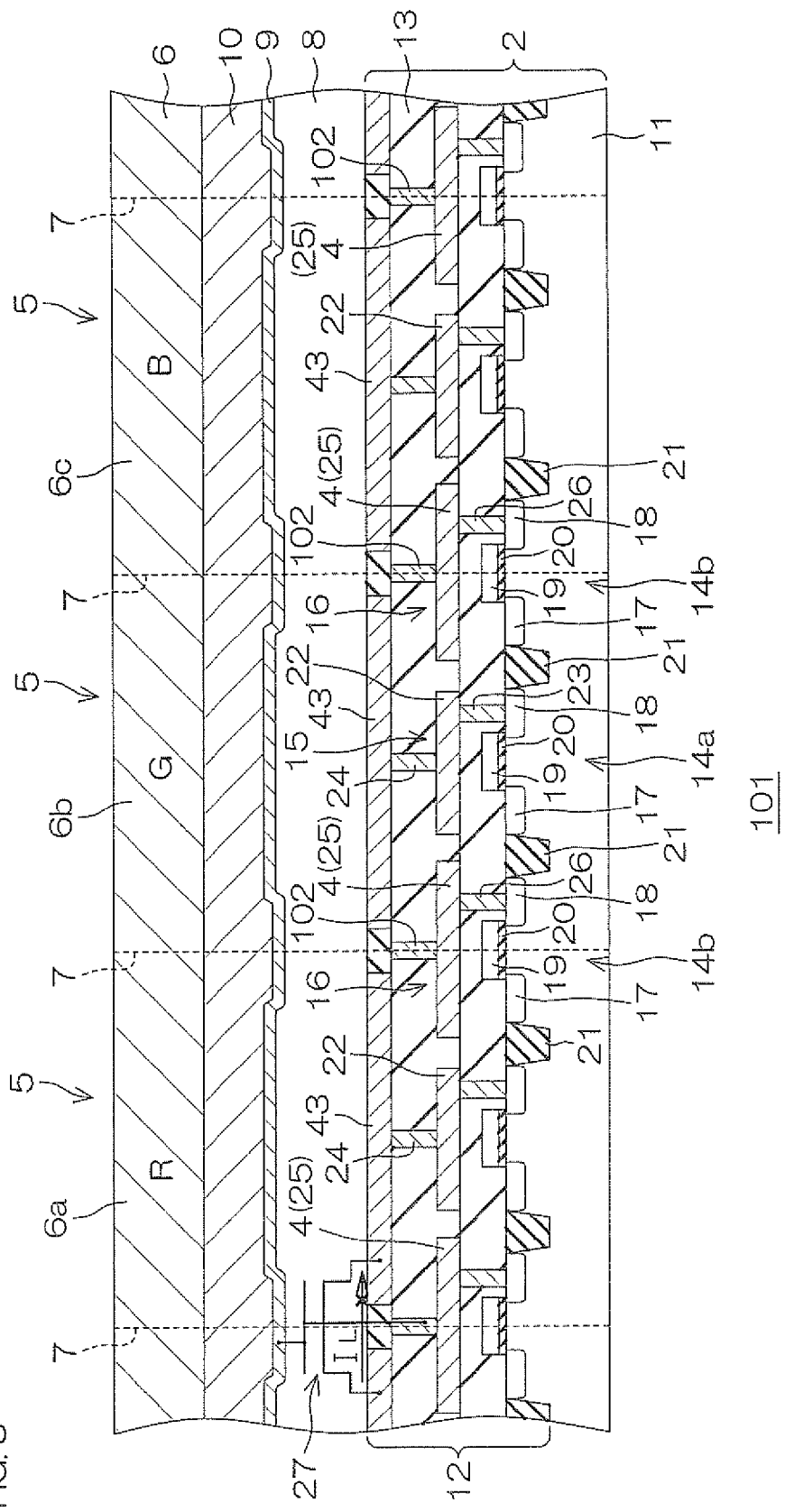
FIG. 8 is a sectional view taken along the section line VIII-VIII in FIG. 7.

FIG. 7 is a schematic plan view of an organic EL device 101 according to a Sixth Preferred Embodiment of the present invention. FIG. 8 is a sectional view taken along the section line VIII-VIII in FIG. V. The organic EL device 101 according to the Sixth Preferred Embodiment is different from the organic EL device 1 according to the First Preferred Embodiment in that second wiring 16 includes a gate via electrode 102 and in that bottom electrodes 43 (see FIG. 4) are formed as is the case with the Third Preferred Embodiment. The other structure is equivalent to that of the organic EL device 1 according to the First Preferred Embodiment. Components in FIGS. 7 and 8 are indicated by the same reference signs as those of corresponding components illustrated in FIGS. 1 to 6, and explanation thereof will be omitted.

As illustrated in FIGS. 7 and 8, the organic EL device 101 further includes a gate via electrode 102, which is formed to extend from a surface of a second wiring layer 25 (a surface opposed to an organic layer 8) to a surface portion of a base layer 2 and is opposed to the organic layer 8 via a portion of an interlayer film 13.

As illustrated in FIG. 7, a plurality of gate via electrodes 102 are formed at a region between bottom electrodes 43 in a planar view seen from the normal direction of the surface of the base layer 2. More specifically, the gate via electrodes 102 are formed along boundaries 7 of the respective pixels 5 and are formed in a dot form so as to surround the periphery of the respective bottom electrodes 43. Each gate via electrode 102 is formed astride adjacent pixels 5 so as to cross a boundary 7 of pixels 5. Although a structure in which gate via electrodes 102 are formed at a regular interval is illustrated in FIG. 7, the gate via electrodes 102 may be formed at mutually different intervals.

Each gate via electrode 102 is formed to have the same shape as that of a second via electrode 24. Each gate via electrode 102 and each second via electrode 24 are formed to have a quadrangular shape in a planar view in the present preferred embodiment. The width $W_4$ of each gate via electrode 102 is smaller than the width $W_1$ of a region between mutually adjacent bottom electrodes 43 (i.e., $0<W_4<W_1$) and is, for example, 0.1 μm to 1.0 μm. Although an example in which the width $W_4$ of each gate via electrode 102 is equal to the width $W_3$ of each second via electrode 24 is illustrated in FIG. 7, the width $W_4$ of each gate via electrode 102 may be smaller ($W_4<W_3$) than the width $W_3$ of each second via electrode 24. The width $W_4$ of each gate via electrode 102 may also be larger ($W_4>W_3$) than the width $W_3$ of each second via electrode 24.

In the sectional view illustrated in FIG. 8, a top portion of a gate via electrode 102 is formed flush with a top portion of a second via electrode 24, and each gate via electrode 102 and each second via electrode 24 are formed to have the same depth from each top portion toward the thickness direction of the base layer 2. That is, each gate via electrode 102 is separated from mutually adjacent bottom electrodes 43 by the interlayer film 13 interposed between the top portion of the gate via electrodes 102 and the surface of the base layer 2.

FIGS. 9A to 9G are sectional views for explaining manufacturing process steps of the organic EL device 101 illustrated in FIG. 8.

Figure 9A:
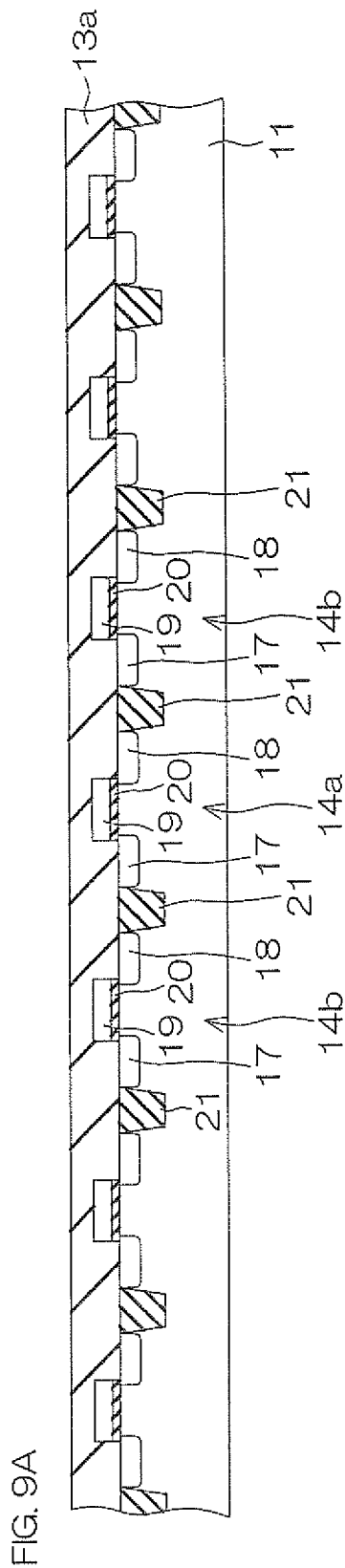
FIGS. 9A to 9G are sectional views for explaining manufacturing process steps of the organic EL device illustrated in FIG. 8.

For forming the organic EL device 101 illustrated in FIGS. 7 and 8, a substrate 11 having a surface portion on which predetermined circuit elements 14a and 14b (MOSFET) are selectively formed is prepared first as illustrated in FIG. 9A. Next, a first interlayer film 13a is formed so as to cover the circuit elements 14a and 14b.

Figure 9B:
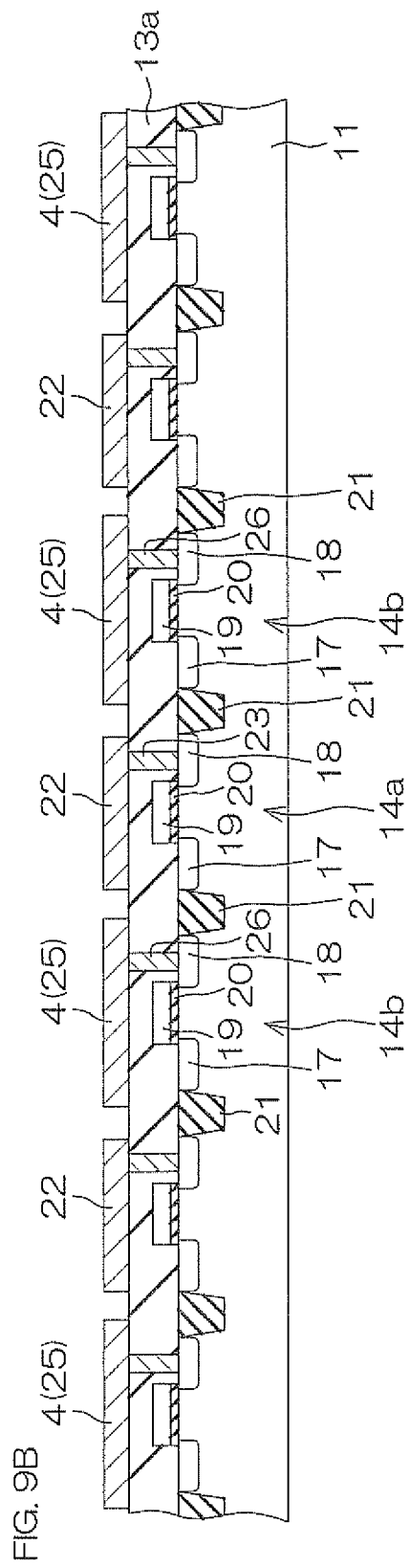

Next, as illustrated in FIG. 9B, first and third via electrodes 23 and 26 are formed to penetrate the first interlayer film 13a and connected respectively with drain layers 18. Next, first wiring layers 22 and second wiring layers 25 are selectively formed on the first interlayer film 13a so as to be connected with the first and third via electrodes 23 and 26.

Figure 9C:
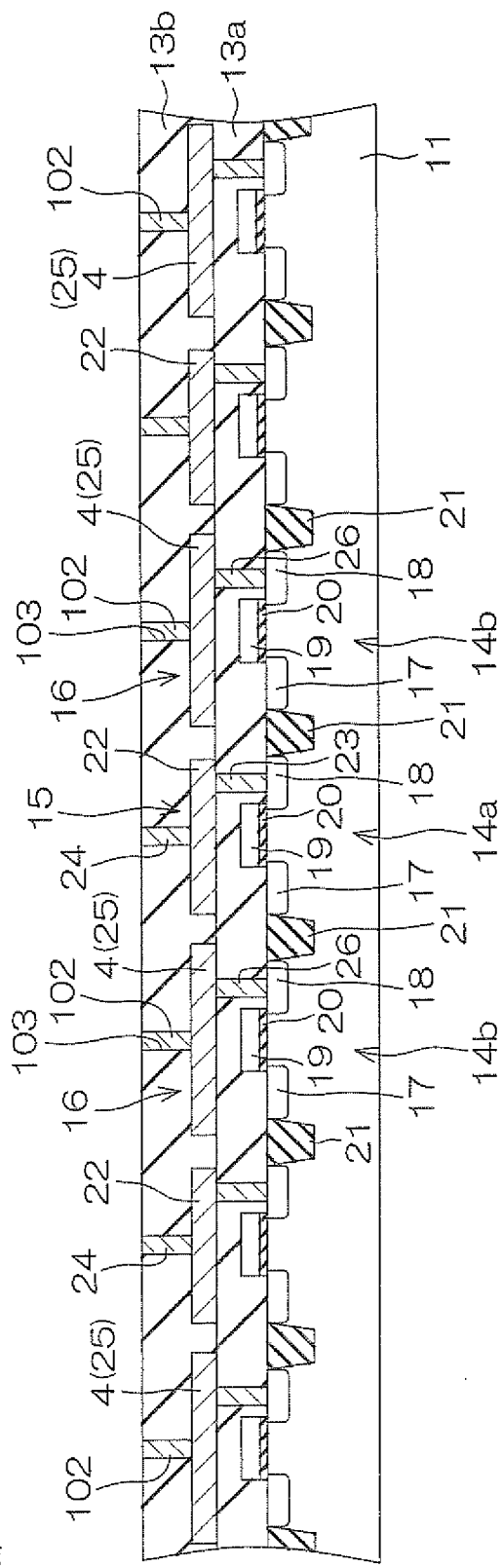

Next, as illustrated in FIG. 9C, a second interlayer film 13b is formed on the first interlayer film 13a so as to cover the first wiring layers 22 and the second wiring layers 25. Next, a hard mask (not illustrated) having openings selectively at regions where the second via electrodes 24 and the gate via electrodes 102 are to be formed is formed on the second interlayer film 13b. Then, etching is performed using the hard mask, so that contact holes 103 which penetrate the second interlayer film 13b and expose the first wiring layers 22 and the second wiring layers 25 are formed selectively. Next, an electrode material is embedded in the respective contact holes 103 by a CVD method, for example, so that the second via electrodes 24 and the gate via electrodes 102 are formed. After the second via electrodes 24 and the gate via electrodes 102 are formed, the hard mask is removed.

Figure 9D:
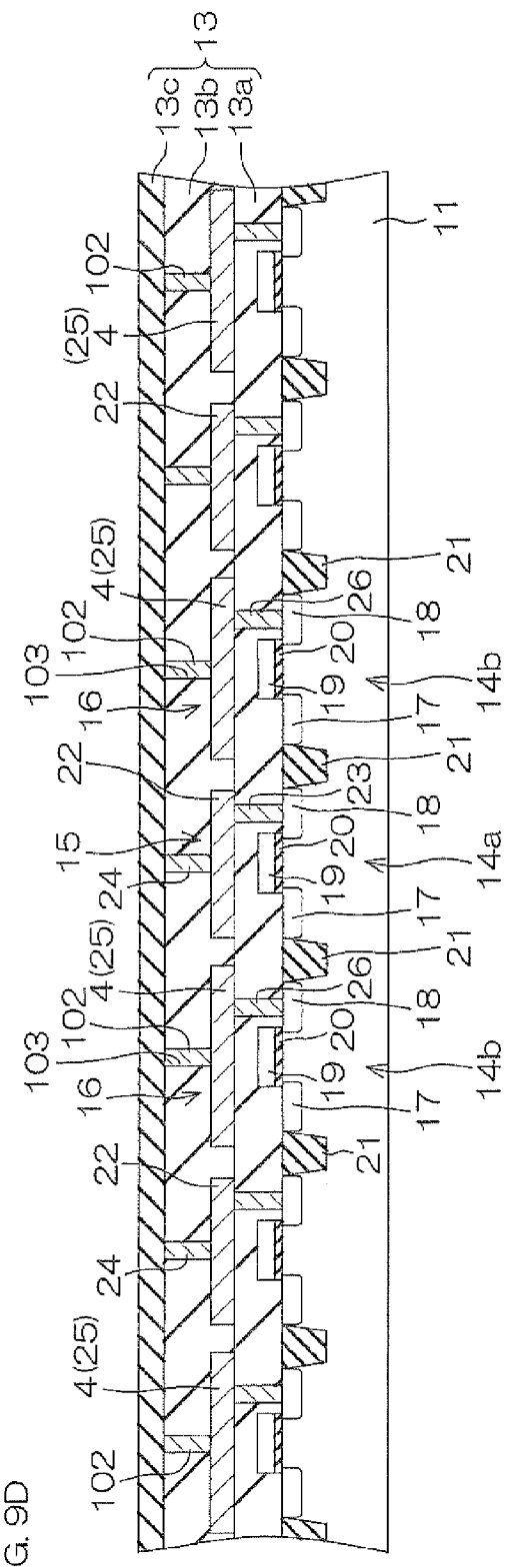

Next, as illustrated in FIG. 9D, a third interlayer film 13c is formed on the second interlayer film 13b so as to cover the second via electrodes 24 and the gate via electrodes 102. The first, second and third interlayer films 13a, 13b and 13c are made of the same insulating material (e.g., $SiO_2$) and form the interlayer film 13.

Figure 9E:
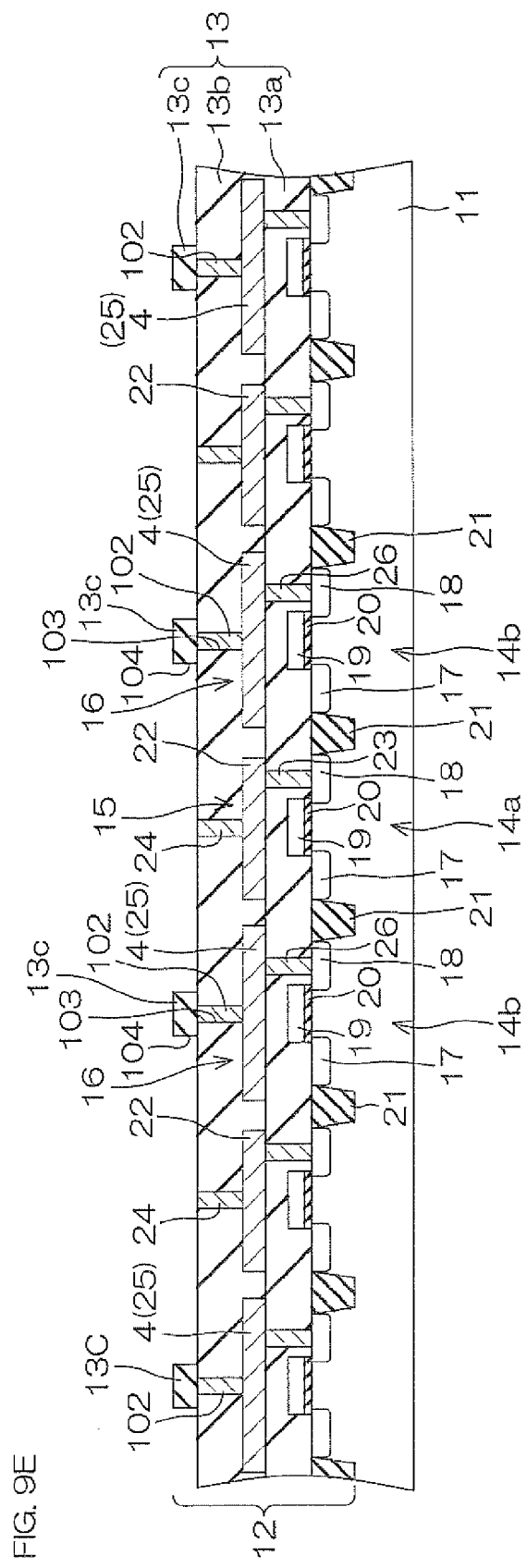

Next, as illustrated in FIG. 9E, a hard mask (not illustrated) which has openings selectively at regions where the bottom electrodes 43 are to be formed and covers regions where the gate via electrodes 102 are to be formed is formed on the third interlayer film 13c. Next, by etching the third interlayer film 13c via the hard mask until the second interlayer film 13b is exposed, for example, openings 104 where an electrode material of the bottom electrodes 43 is to be embedded are formed. Here, regions where the gate via electrodes 102 are formed are covered by the third interlayer film 13c. After the openings 104 are formed, the hard mask is removed.

Figure 9F:
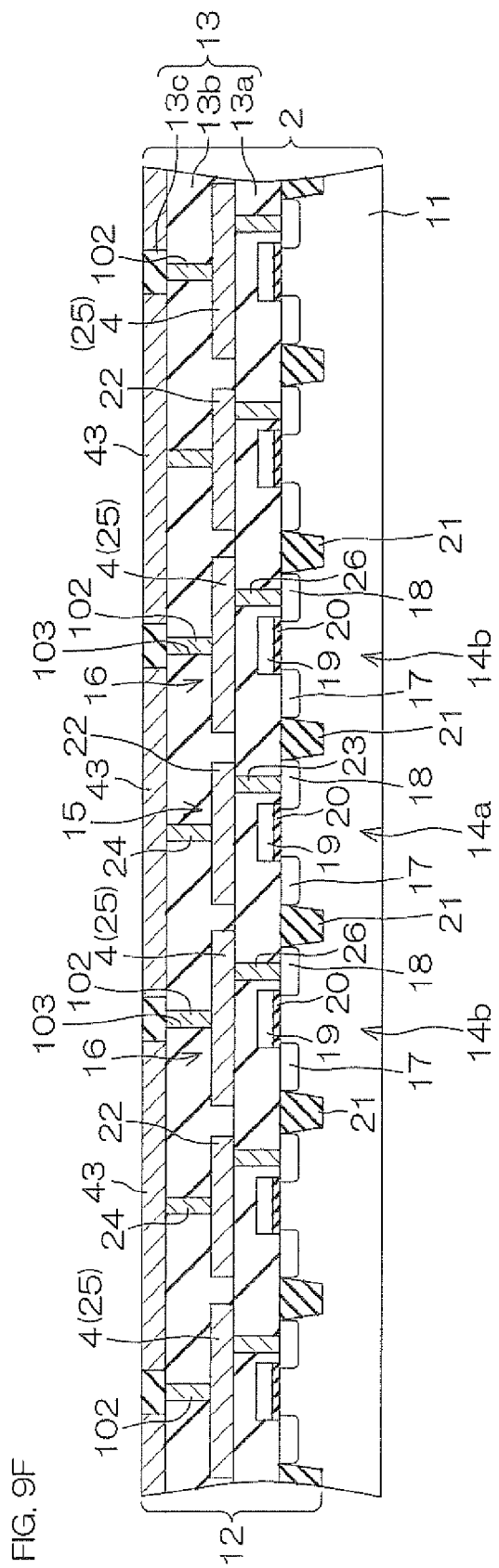

Next, as illustrated in FIG. 9F, an electrode material of the bottom electrodes 43 is deposited on the second interlayer film 13b so as to fill the openings 104, so that an electrode material layer (not illustrated) is formed. Next, the surface of the electrode material layer is abraded by a CMP method so as to make the surface of the electrode material layer flush with the surface of the third interlayer film 13c. This forms the bottom electrodes 43 embedded in the interlayer film 13 and the gate via electrodes 102 opposed to the organic layer 8 with a portion of the interlayer film 13 interposed therebetween.

Figure 9G:
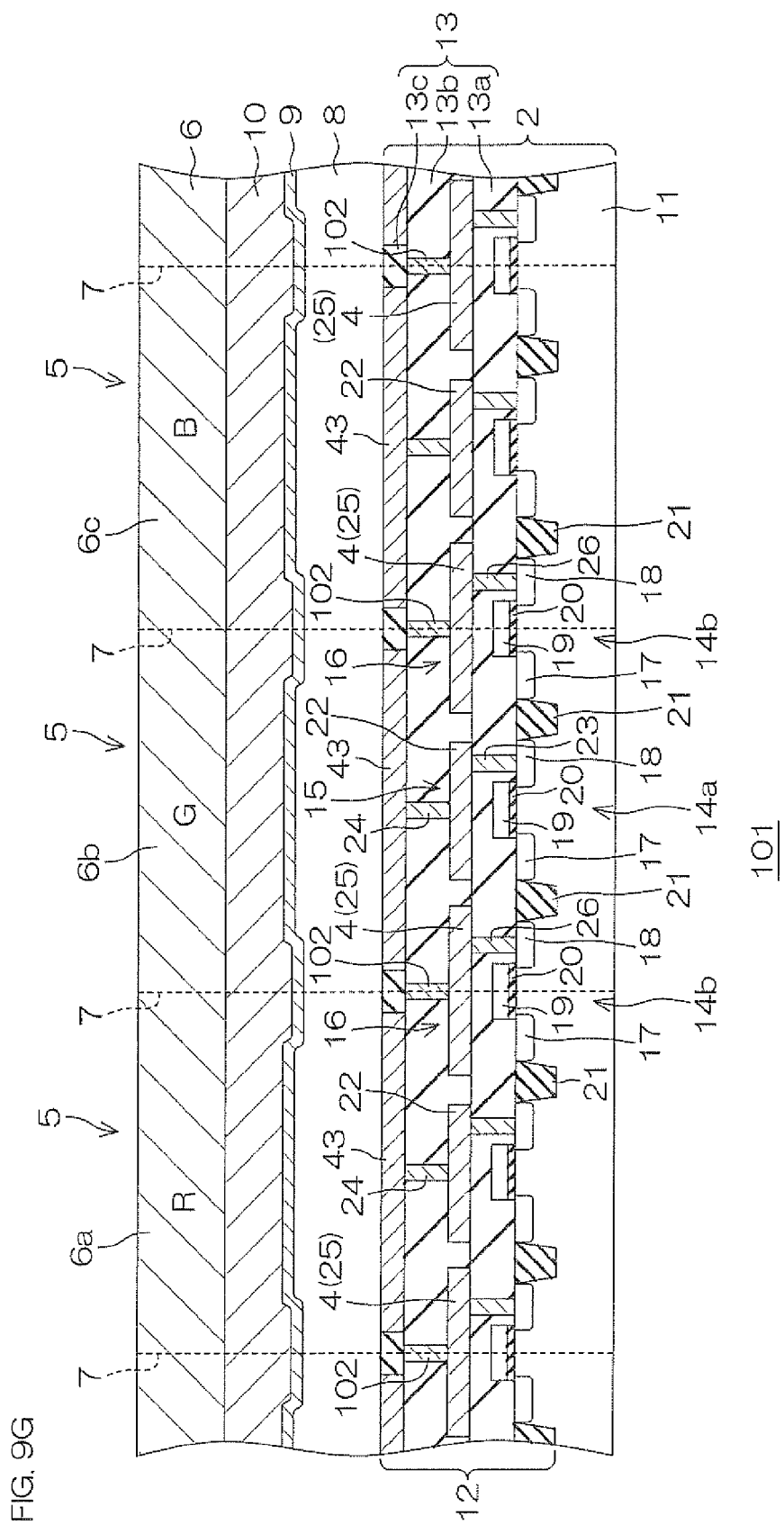

Next, as illustrated in FIG. 9G, the organic layer 8, a top electrode 9, a sealing layer 10 and a color filter 6 are formed in this order on the surface of the interlayer film 13. The organic EL device 101 is manufactured through the above process steps.

As described above, with the structure of the organic EL device 101, the gate via electrodes 102 are formed so as to extend from the surface of the second wiring layers 25 to a surface portion of the base layer 2, thereby it is possible to put a portion where voltage applied to the second wiring layers 25 acts on the channel of the parasitic transistor 27 nearer to the channel. That is, in a case where the gate via electrodes 102 are formed, it is possible to cause voltage applied to the second wiring layers 25 to act on the channel of the parasitic transistor 27 more effectively than a case where the second wiring layers 25 are formed singularly as is the case with the First Preferred Embodiment described above or the like. Since this further limits the expansion of the channel region, it is possible to limit flow of leakage current $I_L$ to a next pixel 5 effectively. As a result, it becomes possible to reduce the occurrence of electrical color mixing (crosstalk) effectively.

Moreover, since the gate via electrodes 102 can be formed in the same process step as the process step of forming the second via electrodes 24, it is possible to prevent an increase in the number of manufacturing process steps.

Moreover, with the structure of the organic EL, device 101, the second wiring layers 25 are placed all over a region below a region between bottom electrodes 43 so as to be overlapped with a rim portion of bottom electrodes 43 as is the case with the First Preferred Embodiment described above or the like, thereby it is possible to limit the expansion of the channel region all over the region between the bottom electrodes 43.

Furthermore, since the second wiring layers 25 are formed to be overlapped with a rim portion of the respective bottom electrodes 43, the second wiring layers 25 exist at the whole region between the bottom electrodes 43, i.e., the whole region where the gate via electrodes 102 are to be formed. Consequently, it is possible to connect the gate via electrodes 102 with the second wiring layers 25 reliably. It is therefore possible with the structure of the organic EL device 101 to form the gate via electrodes 102 without constraint in the freedom of design.

Figure 10:
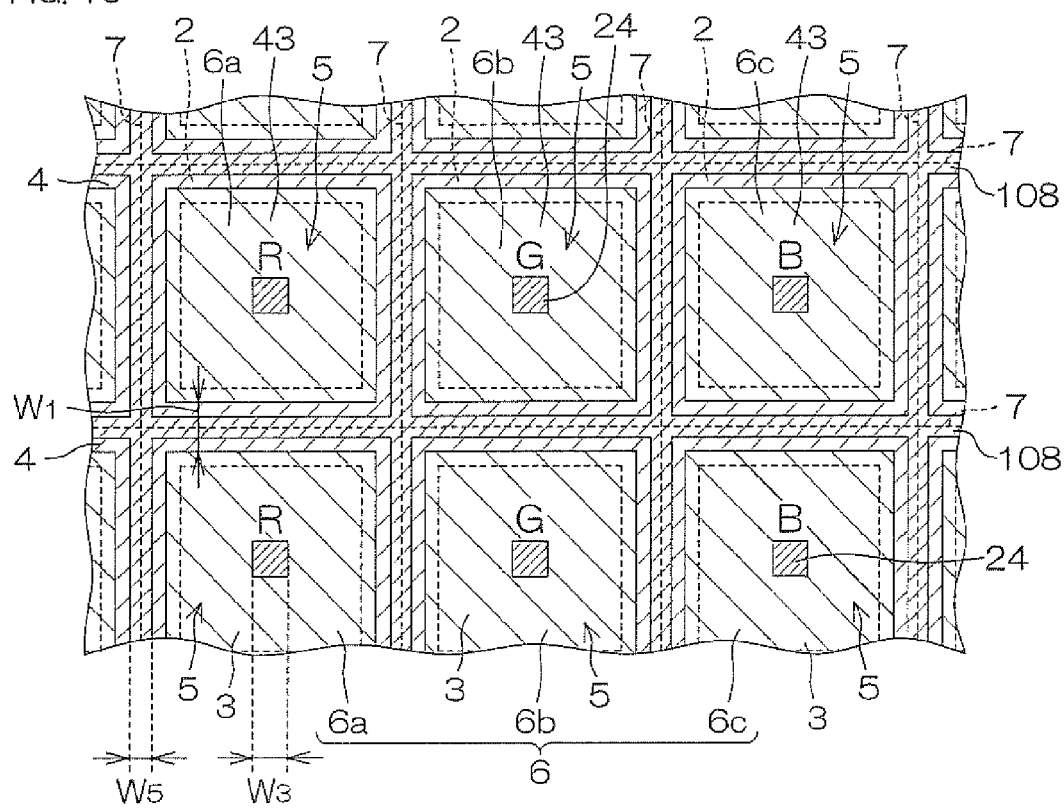
FIG. 10 is a schematic plan view of an organic EL device according to a Seventh Preferred Embodiment of the present invention.

FIG. 10 is a schematic plan view of an organic EL device 107 according to a Seventh Preferred Embodiment of the present invention. The organic EL device 107 according to the Seventh Preferred Embodiment is different from the organic EL device 101 according to the Sixth Preferred Embodiment described above in that gate via electrodes 108 in a linear form are formed instead of the gate via electrodes 102 in a dot form. The other structure is equivalent to that of the organic EL device 101 according to the Sixth Preferred Embodiment. Components in FIG. 10 are indicated by the same reference signs as those of corresponding components illustrated in FIGS. 1 to 9 described above, and explanation thereof will be omitted.

The gate via electrodes 108 are formed at a region between bottom electrodes 43. More specifically, the gate via electrodes 108 are formed in a linear form on boundaries 7 of respective pixels 5 so as to surround the periphery of the bottom electrodes 43 in the present preferred embodiment. Each gate via electrode 108 is formed to have a width different from that of a second via electrode 24. The width $W_5$ of each gate via electrode 108 is smaller than the width $W_3$ of each second via electrode 24 and is, for example, 0.1 µm to 1.0 µm. Such gate via electrodes 108 in a linear form can be formed by only modifying the layout of a hard mask to be used for forming contact holes 103 (second via electrodes 24 and gate via electrodes 102) in the above-described process step of FIG. 9O.

As described above, with the structure of the organic EL device 107, the gate via electrodes 108 are formed so as to surround the periphery of the bottom electrodes 43, thereby it is possible to provide an effect similar to the effect explained in the Sixth Preferred Embodiment described above.

Moreover, since the width $W_5$ of each gate via electrode 108 is smaller than the width $W_3$ of each second via electrode 24, it is possible to connect the gate via electrode 108 with the second wiring layer 25 in a favorable manner. That is, as an electrode material is deposited from the side surface side of each contact hole 103 in the process step of embedding an electrode material in the respective contact holes 103 in the above-described process step of FIG. 9C, it is possible to integrate an electrode material deposited at one side surface and an electrode material deposited at the other side surface inside the contact holes 103 of the gate via electrodes 108 since the width $W_5$ of each gate via electrode 108 is smaller than the width $W_3$ of each second via electrode 24. This ensures favorable contact between the gate via electrodes 108 in a linear form and the second wiring layer 25.

FIG. 11 is a schematic plan view of an organic EL device 81 for illustrating a modified example of a pixel array according to the First Preferred Embodiment through the Seventh Preferred Embodiment.

The organic EL device 81 includes a base layer 82, a bottom electrode 83, an embedded gate electrode 84, a plurality of pixels 85 and a color filter 86.

In the organic EL device 81, a plurality of bottom electrodes 83 are arranged in a honeycomb form at a predetermined interval. That is, a plurality of pixels 85 are also arranged in a honeycomb form so as to correspond to the plurality of bottom electrodes 83. The width $W_2$ of a region between mutually adjacent bottom electrodes 83 is preferably equal to or smaller than 2 µm.

Embedded gate electrodes 84 are formed on the base layer 82 at a predetermined interval from the respective bottom electrodes 83 in a planar view seen from the normal direction so as to surround the respective bottom electrodes 83. The embedded gate electrodes 84 in the present preferred embodiment are located on boundaries 87 of the respective pixels 85 as an array example. In addition, an exposed gate electrode 54 as those in the Fourth Preferred Embodiment and Fifth Preferred Embodiment may be applied instead of the embedded gate electrode 84.

Similarly, an R filter 86a, a G filter 86b and a B filter 86c in the color filter 86 having an ROB filter are also arranged in a honeycomb form so as to correspond to the array of the respective pixels 85.

Regarding an ROB filter, three G filters 86b and three B filters 86c are arranged alternately around one R filter 86a, for example. Similarly, three R filters 86a and three B filters 86c are arranged alternately around one G filter 86b. Similarly, three R filters 86a and three G filters 86b are arranged alternately around one B filter 86c.

With such an array of the pixels 85, filters 86 (86a, 86b, 86c) all having different color gamuts are arranged at adjoining pixels 85 and therefore deflection does not occur in color development. Consequently, it is possible to obtain an organic EL device providing favorable color development by applying the array of the pixels 85 to the First Preferred Embodiment through Seventh Preferred Embodiment.

Although the above description has explained preferred embodiments of the present invention, the present invention can be implemented by other configurations.

For example, although the First Preferred Embodiment through Seventh Preferred Embodiment described above include a hole transport layer (HTL)/an organic light emitting layer (LEL)/an electron transport layer (ETL) formed in this order from the surface of a base layer (2, 82), a hole injection layer (HIL), an electron injection layer (EIL), a hole blocking layer (HBL) and/or an electron blocking layer (EBL) may be included as appropriate.

Moreover, although the above description of the First Preferred Embodiment through Seventh Preferred Embodiment has explained the structure of a case where respective bottom electrodes (3, 43, 53, 73, 83) function as an anode and a top electrode (9) functions as a cathode, respective bottom electrodes may function as a cathode and a top electrode may function as an anode. In such a case, a negative constant value is applied to the respective bottom electrodes. Consequently, the polarity of circuit elements (14a, 14b) corresponding to the respective bottom electrodes is also reversed. For example, a p-type MOSFET is applied, although an n-type MOSFET is illustrated in the First Preferred Embodiment through Seventh Preferred Embodiment described above.

Moreover, although an electric potential control circuit (12, 62) is formed in the base layer in the First Preferred Embodiment through Seventh Preferred Embodiment described above, any kind of an electric potential control circuit may be formed as long as the electric potential of the bottom electrodes and the gate electrodes (4, 39, 54, 84) can be controlled individually. Consequently, for example, an IGBT (Insulated Gate Bipolar Transistor) may be formed on a substrate (11) instead of a MOSFET, for example. Moreover, various kinds of circuit elements such as a capacitor or a resistor may be formed in an interlayer film (13). By combining such circuit elements with wirings (15, 16, 36, 56), integrated circuits such as LSI (Large Scale Integration), SSI (Small Scale Integration), MSI (Medium Scale Integration), VLSI (Very Large Scale Integration) or ULSI (Ultra-Very Large Scale Integration) may be constructed.

Moreover, only one wiring layer may be formed in the interlayer film as is the case with the above-described preferred embodiments, or a multilayer wiring layer including two layers, three layers or more may be employed.

Moreover, although the exposed gate electrodes 54 and/or the bottom electrodes 53 in the Fourth Preferred Embodiment and Fifth Preferred Embodiment described above are formed so as to have a tapered shape projecting from the surface of an interlayer film, the shape of the respective electrodes is not limited to a tapered shape and may be a quadrangular shape in a planar view (rectangular shape), for example.

Although the exposed gate electrodes 54 in the Fourth Preferred Embodiment and Fifth Preferred Embodiment described above are formed so as to project toward the organic layer 8, the exposed gate electrodes 54 may be embedded so that the surface thereof is located at the same plane as the surface of the interlayer film. Here, the exposed gate electrode 54 may include a fourth via electrode 67 having the surface coated with the gate insulating film 68.

Although the above description of the Sixth Preferred Embodiment has explained an example where gate via electrodes 102 are formed in a dot form, the gate via electrodes 102 may be formed so as to selectively continue into mutually adjacent gate via electrodes 102.

Although the above description of the Sixth Preferred Embodiment has explained an example where the gate via electrodes 102 and the second via electrodes 29 are formed to have a quadrangular shape in a planar view, the gate via electrodes 102 and the second via electrodes 24 may be formed to have a circular shape in a planar view.

Although the above description of the Sixth Preferred Embodiment and Seventh Preferred Embodiment has explained an example where the bottom electrodes 3 are embedded in the interlayer film 13, the bottom electrodes 3 may be formed to project from the surface of the interlayer film 13 toward the top electrode 9 as is the case with the First Preferred Embodiment described above.

Although the above description of the Sixth Preferred Embodiment and Seventh Preferred Embodiment has explained an example where the second wiring layer 25 and the first wiring layer 22 are formed at the same layer, the second wiring layer 25 may be formed at a layer different from the first wiring layer 22.

A variety of other design changes can be made within the scope of description in the claims.

The preferred embodiments of the present invention are merely specific examples used for clarifying the technical contents of the present invention, and the present invention should not be interpreted as being limited to only those specific examples, and the spirit and scope of the present invention shall be limited only by the appended claims.

This application corresponds to Japanese Patent Application No. 2012-225452 filed on Oct. 10, 2012 in the Japan Patent Office and Japanese Patent Application No. 2013-182490 filed on Sep. 3, 2013 in the Japan Patent Office, the entire disclosure of which are incorporated herein by reference.

The invention claimed is:

1. An organic EL device, comprising:
a base layer;
a plurality of bottom electrodes arranged in a surface portion of the base layer at an interval in a lateral direction along a surface of the base layer;
an organic layer which contains an organic light emitting material and is placed on the base layer so as to cover the plurality of bottom electrodes collectively and divided into a plurality of pixels respectively corresponding to the plurality of bottom electrodes;
a top electrode opposed to the plurality of bottom electrodes with the organic layer interposed therebetween; and
a gate electrode, which is placed at a region between mutually adjacent bottom electrodes in a planar view seen from a normal direction of the surface of the base layer, for turning off a parasitic transistor formed by cooperation of the top electrode and mutually adjacent bottom electrodes,
wherein the gate electrode is formed to surround the bottom electrodes in the planar view and has a portion overlapped with a rim portion of the bottom electrode in the planar view.

2. The organic EL device according to claim 1, wherein
the base layer includes a substrate having a surface on which a plurality of circuit elements are formed, and an interlayer film that is placed on the substrate and has a surface portion in which the plurality of bottom electrodes are arranged and wiring for electrically connecting the plurality of circuit elements with the plurality of bottom electrodes, and
the gate electrode is embedded in the interlayer film and opposed to a region between the bottom electrodes with a portion of the interlayer film interposed therebetween.

3. The organic EL device according to claim 2, wherein the wiring includes a wiring layer placed along the surface of the substrate and a via for connecting the wiring layer with the bottom electrode, and
the gate electrode includes a gate wiring layer placed at the same layer as the wiring layer.

4. The organic EL device according to claim 2, wherein the wiring includes a wiring layer placed along the surface of the substrate and a via for connecting the wiring layer with the bottom electrode, and
the gate electrode includes a gate wiring layer placed at a layer different from the wiring layer.

5. The organic EL device according to claim 3, wherein the gate electrode is formed to extend from the surface of the gate wiring layer to the surface of the base layer and further includes a gate via which is opposed to the organic layer with a portion of the interlayer film interposed therebetween.

6. The organic EL device according to claim 5, wherein the gate via is formed to have the same shape as that of the via of the wiring.

7. The organic EL device according to claim 1, wherein
the base layer includes a substrate having a surface on which a plurality of circuit elements are formed, and an interlayer film that is placed on the substrate and has a surface portion in which the plurality of bottom electrodes are placed and wiring for electrically connecting the plurality of circuit elements with the plurality of bottom electrodes, and
the gate electrode is placed at a region between bottom electrodes on the interlayer film and has a surface coated with an insulating film.

8. The organic EL device according to claim 1, wherein the plurality of bottom electrodes include an embedded bottom electrode, which is embedded in the base layer, so that a surface thereof is located at the same plane as the surface of the base layer or at a lower position than that of the surface of the base layer.

9. The organic EL device according to claim 1, wherein a width of a region between the bottom electrodes is equal to or smaller than 2 μm.

10. The organic EL device according to claim 1, wherein the plurality of bottom electrodes are arranged in a matrix form.

11. The organic EL device according to claim 1, wherein the plurality of bottom electrodes are arranged in a honeycomb form.

12. The organic EL device according to claim 1, wherein the plurality of bottom electrodes are made of aluminum (Al), molybdenum (Mo), silver (Ag), platinum (Pt) or an alloy thereof.

13. The organic EL device according to claim 1, wherein the top electrode is made of aluminum (Al), silver (Ag), magnesium silver (MgAg), tin-doped indium oxide (ITO) or zinc-doped indium oxide (IZO).

14. The organic EL device according to claim 13, wherein the top electrode is made of aluminum (Al), silver (Ag) or magnesium silver (MgAg) having a thickness of 0.1 nm to 50 nm.

15. The organic EL device according to claim 13, wherein the top electrode is made of tin-doped indium oxide (ITO) or zinc-doped indium oxide (IZO) having a thickness of 1.0 nm to 500 nm.

16. The organic EL device according to claim 1, further comprising a color filter placed on the top electrode.

17. The organic EL device according to claim 1, wherein a voltage different from a voltage applied to the bottom electrodes is applied continuously to the gate electrode.

18. The organic EL device according to claim 17, wherein the voltage applied to the gate electrode is higher than the voltage applied to the bottom electrodes.

* * * * *